(12) United States Patent
Ootera et al.

(10) Patent No.: US 11,217,628 B2
(45) Date of Patent: Jan. 4, 2022

(54) MAGNETIC MEMORY

(71) Applicant: TOSHIBA MEMORY CORPORATION, Tokyo (JP)

(72) Inventors: Yasuaki Ootera, Yokohama Kanagawa (JP); Tsutomu Nakanishi, Yokohama Kanagawa (JP); Megumi Yakabe, Kawasaki Kanagawa (JP); Nobuyuki Umetsu, Kawasaki Kanagawa (JP); Agung Setiadi, Kokubunji Tokyo (JP); Tsuyoshi Kondo, Kawasaki Kanagawa (JP)

(73) Assignee: TOSHIBA MEMORY CORPORATION, Tokyo (JP)

( * ) Notice: Subject to any disclaimer, the term of this patent is extended or adjusted under 35 U.S.C. 154(b) by 2 days.

(21) Appl. No.: 16/531,275

(22) Filed: Aug. 5, 2019

(65) Prior Publication Data

US 2020/0303457 A1 Sep. 24, 2020

(30) Foreign Application Priority Data

Mar. 18, 2019 (JP) .............................. JP2019-050515

(51) Int. Cl.
| | | |
|---|---|---|
| *H01L 27/22* | (2006.01) | |
| *H01L 43/08* | (2006.01) | |
| *G11C 11/16* | (2006.01) | |
| *G11C 19/08* | (2006.01) | |
| *H01L 43/02* | (2006.01) | |

(52) U.S. Cl.
CPC .......... *H01L 27/226* (2013.01); *G11C 11/161* (2013.01); *G11C 11/1675* (2013.01); *G11C 19/0841* (2013.01); *H01L 43/02* (2013.01); *H01L 43/08* (2013.01)

(58) Field of Classification Search
CPC .............. G11C 11/161; G11C 11/1675; G11C 19/0841; H01L 43/02; H01L 43/08; H01L 27/226

See application file for complete search history.

(56) References Cited

U.S. PATENT DOCUMENTS

| | | | |
|---|---|---|---|
| 5,680,091 A * | 10/1997 | Maeda | .................... B82Y 25/00 |
| | | | 257/E43.004 |
| 9,171,888 B2 | 10/2015 | Quinsat et al. | |
| 9,293,696 B2 | 3/2016 | Ootera et al. | |
| 2005/0195532 A1* | 9/2005 | Sugiyama | .............. G11C 11/161 |
| | | | 360/322 |
| 2014/0104941 A1* | 4/2014 | Kondo | ................... G11C 11/161 |
| | | | 365/171 |

(Continued)

FOREIGN PATENT DOCUMENTS

| | | | |
|---|---|---|---|
| JP | 6204769 B2 | 9/2017 | |
| JP | 6271350 B2 | 1/2018 | |

(Continued)

*Primary Examiner* — Han Yang
(74) *Attorney, Agent, or Firm* — Finnegan, Henderson, Farabow, Garrett & Dunner L.L.P.

(57) ABSTRACT

A magnetic memory according to an embodiment includes: a magnetic member having a cylindrical form, the magnetic member including a first end portion and a second end portion and extending in a first direction from the first end portion to the second end portion, the first end portion having an end face, which includes a face inclined with respect to a plane perpendicular to the first direction.

36 Claims, 22 Drawing Sheets

(56) References Cited

U.S. PATENT DOCUMENTS

| | | | |
|---|---|---|---|
| 2016/0155778 A1* | 6/2016 | Shimada | H01L 43/12 257/252 |
| 2016/0197268 A1* | 7/2016 | Yakabe | H01L 43/12 257/421 |
| 2017/0229640 A1* | 8/2017 | Kado | G11C 11/1675 |
| 2018/0337328 A1* | 11/2018 | Nam | H01L 43/12 |
| 2018/0358104 A1 | 12/2018 | Ootera et al. | |
| 2019/0287598 A1 | 9/2019 | Shimada et al. | |

FOREIGN PATENT DOCUMENTS

| JP | 2019-3989 A | 1/2019 |
|---|---|---|
| JP | 2019-160372 A | 9/2019 |

\* cited by examiner

RATIO OF SECOND FACE 101f₂: 0

RATIO OF SECOND FACE 101f₂ < 1

MAGNETIC MEMORY

CROSS REFERENCE TO RELATED APPLICATIONS

This application is based upon and claims the benefit of priority from the prior Japanese Patent Application No. 2019-050515, filed on Mar. 18, 2019, the entire contents of which are incorporated herein by reference.

FIELD

Embodiments described herein relate generally to magnetic memories.

BACKGROUND

A magnetic memory is known, in which domain walls of a magnetic member are moved (shifted) due to a current caused to flow through the magnetic member. In such a magnetic memory, a first electrode is electrically connected to one end of the magnetic member, and a second electrode is connected to the other end. The domain walls are moved when a shift current flows between the first electrode and the second electrode. Such a magnetic memory stores data by magnetizing the end of a magnetic member.

However, magnetizing the end of the magnetic member to write data is not easy.

DETAILED DESCRIPTION

A magnetic memory according to an embodiment of the present invention includes: a magnetic member having a cylindrical form, the magnetic member including a first end portion and a second end portion and extending in a first direction from the first end portion to the second end portion, the first end portion having an end face, which includes a face inclined with respect to a plane perpendicular to the first direction.

First Embodiment

Figure 1:
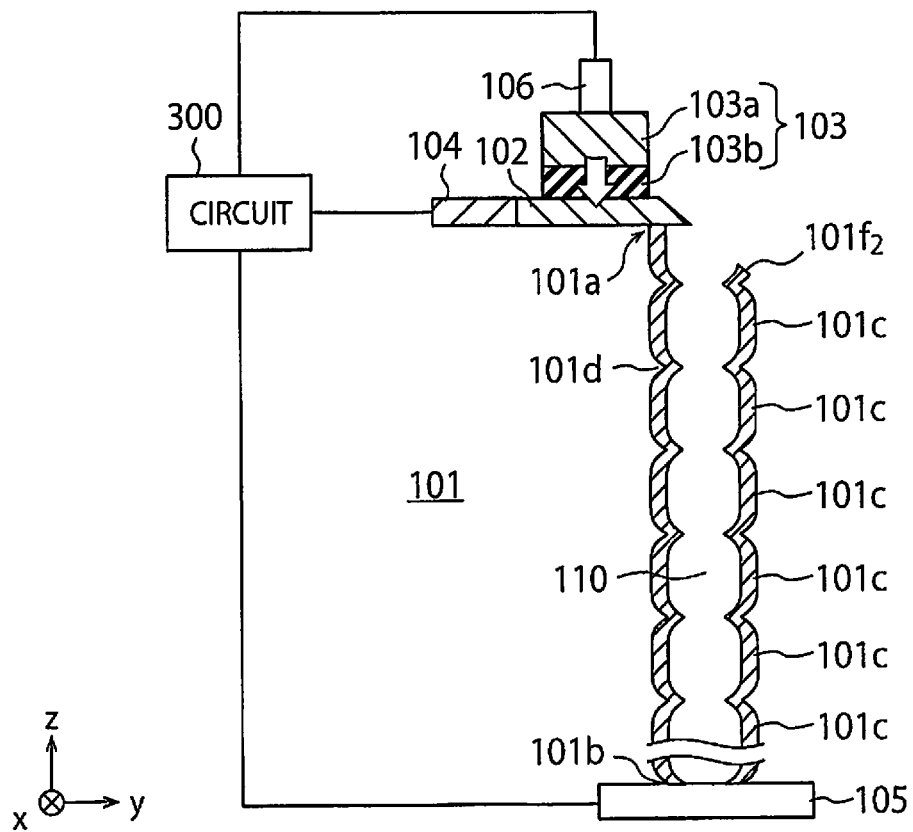
FIG. 1 is a cross-sectional view of a magnetic memory according to a first embodiment.

FIG. 1 is a cross-sectional view of a magnetic memory according to a first embodiment. The magnetic memory according to the first embodiment includes a cylindrical magnetic member 101 having a hollow portion 110. The magnetic member 101 is formed of a perpendicular magnetization material. Specifically, the easy magnetization axis of the magnetic member 101 is in a plane that is perpendicular to a z direction (vertical direction in FIG. 1). In this and other embodiments, a section of the magnetic member 101 taken along an x-y plane has a ring shape. However, the shape is not limited to the ring shape. The hollow portion 110 may be filled with a nonmagnetic insulating material (for example, silicon oxide, silicon nitride, or alumina), as will be described later in the descriptions of manufacturing methods.

The magnetic member 101 extends in the z direction, and has an end portion 101a and an end portion 101b. The outer circumference shape of a section of the magnetic member 101 taken along a plane that is perpendicular to the z direction at somewhere between the end portion 101a and the end portion 101b may be circular, oval, or polygonal.

The end portion 101a of the magnetic member 101 is connected to an end of a magnetic layer 102. A magnetoresistive element 103 (for example, a magnetic tunnel junction (MTJ) element) is disposed on the magnetic layer 102. An electrode 104 is electrically connected to the other end of the magnetic layer 102. An electrode 105 is electrically connected to the end portion 101b of the magnetic member 101. A third electrode 106 is electrically connected to a top face of the magnetoresistive element 103. The expression "A and B are electrically connected" herein means that A and B may be directly connected or that A and B may be indirectly connected with a conductive material disposed between A and B.

The magnetoresistive element 103 includes a magnetization fixed layer 103a, in which the magnetization is fixed, and a nonmagnetic layer 103b disposed between the magnetization fixed layer 103a and the magnetic layer 102.

The magnetic member 101 includes a plurality of regions 101c arranged in the z direction. The regions 101c are separated from one another by narrow portions 101d disposed on an outer face of the magnetic member 101. The regions 101c have at least one magnetic domain. When a drive current (shift current) is supplied between the electrode 104 and the electrode 105, the domain walls in the magnetic member 101 move in the z direction. If no drive current is supplied, the domain walls stay at the narrow portions 101d.

(Write Method)

Data is written to the magnetic member 101 by causing a write current to flow between the electrode 104 and the third electrode 106 via the magnetoresistive element 103. The write current is supplied from a circuit 300. When a magnetization direction (information) that is the same as the magnetization direction of the magnetization fixed layer 103a is to be written to the magnetic layer 102, the write current is caused to flow from the electrode 104 to the third electrode 106 via the magnetoresistive element 103. In this case, electrons flow from the third electrode 106 to the magnetization fixed layer 103a of the magnetoresistive element 103 and are spin-polarized. The spin-polarized electrons having spin that is in the same direction as the magnetization direction of the magnetization fixed layer 103a become majority-spin electrons, which flow into the magnetic layer 102 via the nonmagnetic layer 103b and act on spins of the magnetic layer 102, and cause the magnetization direction of the magnetic layer 102 to become the same as the magnetization direction of the magnetization fixed layer 103a.

When a magnetization direction (information) that is opposite (antiparallel) to the magnetization direction of the magnetization fixed layer 103a is to be written to the magnetic layer 102, a write current is caused to flow from the third electrode 106 to the electrode 104 via the magnetoresistive element 103. In this case, electrons flow from the electrode 104 to the magnetic layer 102 and are spin-polarized. The spin-polarized electrons then flow through the nonmagnetic layer 103b to the magnetization fixed layer 103a. At this time, the electrons having spin that is in the same direction as the magnetization direction of the magnetization fixed layer 103a pass through the magnetization fixed layer 103a, but electrons having spin that is in an opposite direction to the magnetization direction of the magnetization fixed layer 103a are reflected at the interface between the nonmagnetic layer 103b and the magnetization fixed layer 103a, return to the magnetic layer 102 and act on spins of the magnetic layer 102, and cause the magnetization direction of the magnetic layer 102 to be opposite to the magnetization direction of the magnetization fixed layer 103a.

Information (magnetization direction) is written to the magnetic layer 102 in this manner. The written information may be a magnetization direction that is perpendicular to the film face of the magnetic layer 102. Depending on the material and the thickness of the magnetic layer 102 and other conditions, the written information may be a magnetization direction that is parallel to the film face of the magnetic layer 102, i.e., a y direction. Thereafter, a drive current is caused to flow from the electrode 105 to the electrode 104 via the magnetic member 101 to send the data written to the magnetic layer 102 to a region 101c that is the closest to the end portion 101a of the magnetic member 101.

(Read Method)

A drive current is supplied from the electrode 104 to the electrode 105 to move (shift) information (data) to be read to the magnetic layer 102. The drive current is supplied by the circuit 300. The drive current may be supplied between the electrode 105 and the electrode 106 by the circuit 300.

Thereafter, a read current is caused to flow between the electrode 104 and the third electrode 106 via the magnetoresistive element 103 in order to read the magnetization direction (information) of the magnetic layer 102. The read current is supplied by the circuit 300.

The magnetic member 101 may be a multilayer film including layers of cobalt and nickel, for example. The materials of the magnetic member 101 may also be an alloy containing an element selected from a group consisting of iron, cobalt, platinum, palladium, magnesium, and a rare earth element, in addition to cobalt and nickel. The magnetic layer 102 may contain a magnetic element such as iron or cobalt.

Figure 2:
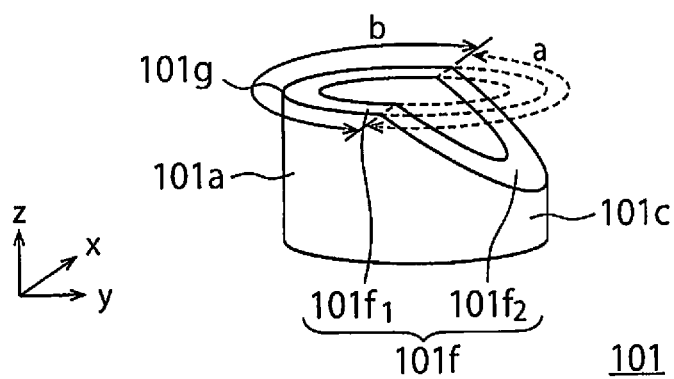
FIG. 2 is a perspective view of part of a magnetic member included in the magnetic memory according to the first embodiment.

In this embodiment and other embodiments described below, the end portion 101a of the magnetic member 101 has an end face 101f, as shown in FIG. 2. The end face 101f is a face that is most distant from the end portion 101b when viewed in the z direction. The end face 101f has a first face 101f$_1$ and a second face 101f$_2$. The first face 101f$_1$ crosses the z direction and has a portion 101g of the region 101c that is the closest to the end portion 101a and connected to the magnetic layer 102. The second face 101f$_2$ crosses the z direction, and is inclined with respect to a plane that is perpendicular to the z direction. In the magnetic member 101 shown in FIG. 2, the first face 101f$_1$ and the second face 101f$_2$ connect to each other.

The end portion 101a also has a first portion and a second portion. A first cross-sectional area of the first portion sectioned by a first plane that is perpendicular to the z direction is different from a second cross-sectional area of the second portion sectioned by a second plane that is perpendicular to the z direction. The first portion is more distant from the end portion 101b than the second portion, and the first cross-sectional area is smaller than the second cross-sectional area. For example, the first portion is on the end portion 101a side of the magnetic member 101 including the second face 101f$_2$, and the second portion is on the end portion 101b side of the magnetic material 101 including the second face 101f$_2$.

The end portion 101a of the magnetic member 101 has a portion in which the cross-sectional area that is perpendicular to the z direction decreases from the first portion to the second portion in the z direction.

The ratio of the second face 101f$_2$ with respect to the end face 101f of the magnetic member 101 ("the ratio of the second face 101f$_2$") herein (see FIG. 2) is defined by dividing a length of an outer arc of the second face 101f$_2$ projected on a plane that is perpendicular to the z direction (represented by a broken line a) by a sum of a length of an outer arc of the first face 101f$_1$ projected on a plane that is perpendicular to the z direction (represented by a solid line b) and the length of the broken line a (=a+b). In other words, the ratio of the second face 101f$_2$ is a/(a+b).

COMPARATIVE EXAMPLE

Figure 3A:
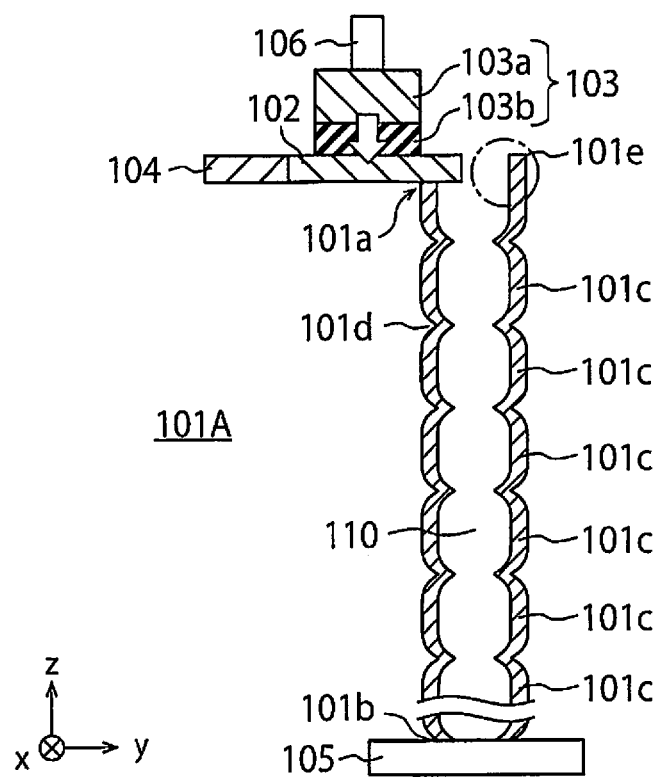
FIG. 3A is a cross-sectional view of a magnetic member included in a magnetic memory according to a comparative example.

FIG. 3A is a cross-sectional view of a magnetic memory according to a comparative example including a pillar-shaped magnetic member 101A having a hollow portion 110. The magnetic member 101A according to the comparative example differs from the magnetic member 101 according to the first embodiment shown in FIG. 1 in that a portion (write position) 101g of the region 101c that is the closest to the end portion 101a, the portion 101g connecting to the magnetic layer 102, is on the same plane as a corner portion 101e (see FIG. 3A) on the opposite side of the hollow portion 110, the plane being perpendicular to the z direction. In other words, the end face of the magnetic member 101A of the comparative example has a first face 101f$_1$ but does not have a second face 101f$_2$, unlike the end face 101f of the magnetic member 101. Therefore, the ratio of the second face 101f$_2$ in the magnetic member 101A of the comparative example is "0."

Figure 4:
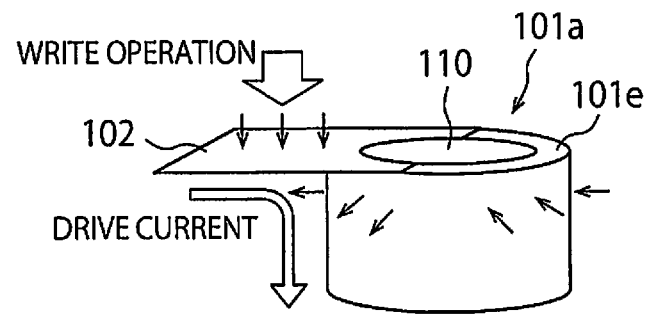
FIG. 4 is a diagram for explaining a problem in writing data to the magnetic memory according to the comparative example.

The end portion 101a of the magnetic member 101A according to the comparative example has the corner portion 101e circled by a broken line on the opposite side to the magnetic layer 102. Data written to the magnetic layer 102 and sent to the region 101c that is the closest to the end portion 101a is less likely to reach the corner portion 101e, and the magnetization direction in the region 101c that is the closest to the magnetic layer 102 is inclined with respect to the y direction as shown by an arrow in FIG. 36, since the magnetization direction cannot be stably controlled in a region in the vicinity of the corner portion 101e, as shown by arrows in FIG. 4. Thus, the region 101c that is the closest to the end portion 101a of the magnetic member 101 cannot be stably magnetized radially.

Figure 3B:
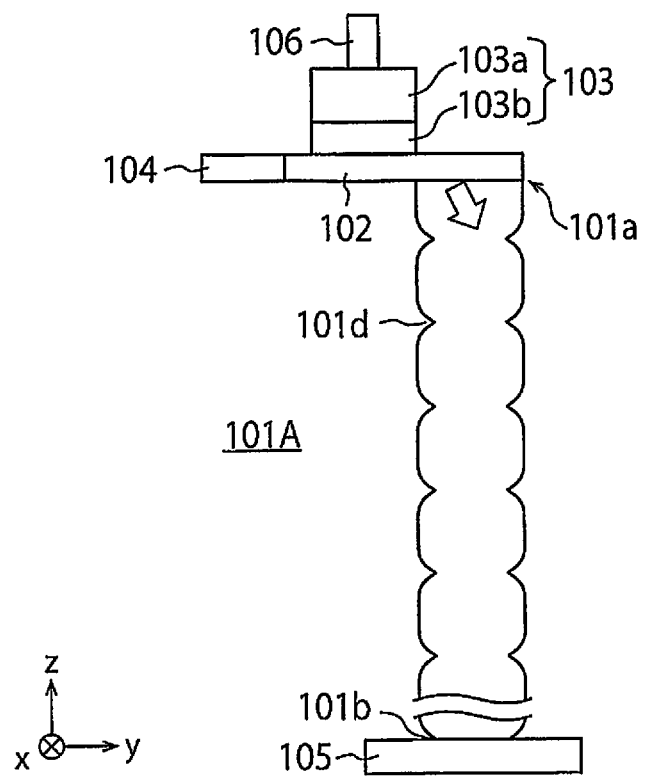
FIG. 3B is an outer appearance diagram for explaining a method of writing data to the magnetic member of the comparative example.
Figure 5:
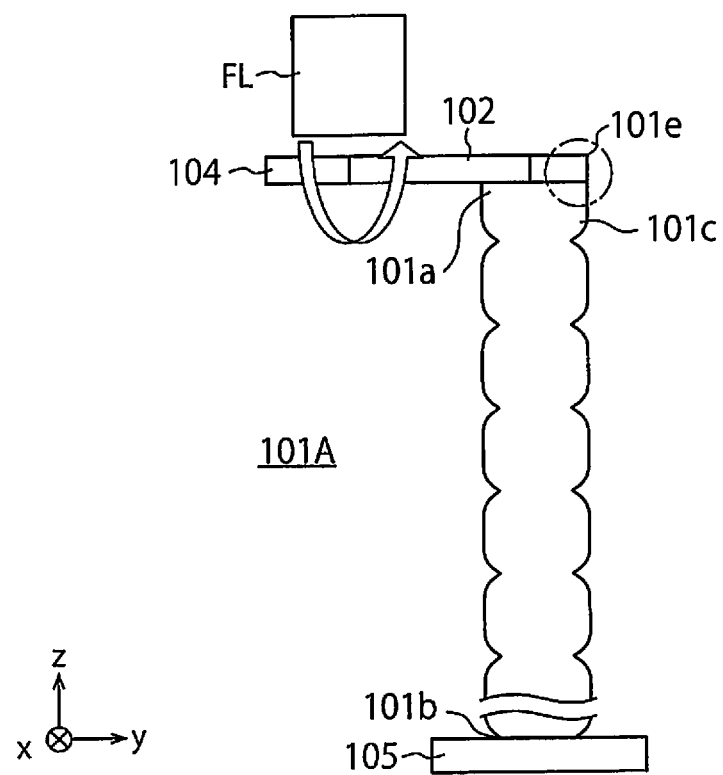
FIG. 5 is an outer appearance diagram of a magnetic memory according to a comparative example including a field line FL as a recording unit.

In FIGS. 3A and 3B, the write operation is performed by using the magnetoresistive element 103. However, instead of the magnetoresistive element 103, a field line FL may be used to write data to the magnetic layer 102, as shown in FIG. 5 that illustrates an external appearance of a magnetic memory including a field line FL as a recording unit. In this case, the field line FL is disposed near the magnetic layer 102, and extends in an x direction. When a write current is supplied to the field line FL, a magnetic field is generated by the write current around the field line FL. Information is written to the magnetic layer 102 by means of the magnetic field. The information (magnetization direction) written to the magnetic layer 102 differs depending on the direction of the write current supplied to the field line FL. Also in this case, a corner portion 101e is present in the end portion 101a of the magnetic member 101A in a region circled by a broken line, which is opposite to the side connecting to the magnetic layer 102. Therefore, the magnetization direction cannot be stably controlled in the region around the corner portion 101e, like the cases explained with reference to FIG. 3A to FIG. 4. As a result, the region 101c that is the closest to the end portion 101a of the magnetic member 101A cannot be stably and radially magnetized.

Figure 6:
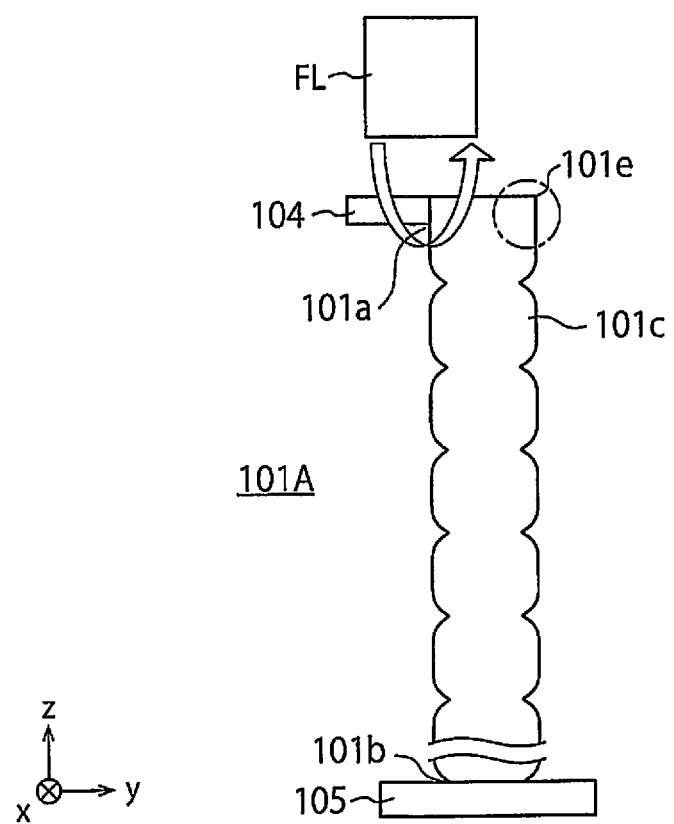
FIG. 6 is an outer appearance diagram of a magnetic memory according to a comparative example including a field line FL as a recording unit.

Furthermore, the magnetic layer 102 may be excluded and the electrode 104 may be connected to the end portion 101a of the magnetic member 101A and the field line FL may be disposed near the end portion 101a, as shown in FIG. 6, which illustrates an outer appearance of a magnetic memory including a field line FL as a recording unit. In this case, a write current is supplied to the field line FL, and data is directly written to the region 101c that is the closest to the end portion 101a by means of a magnetic field generated by the field line FL. However, also in this case, a corner portion 101e is present in the end portion 101a of the magnetic member 101A in a region circled by a broken line, which is opposite to the side connecting to the magnetic layer 102. Therefore, the magnetization direction cannot be stably controlled in the region around the corner portion 101e, like the cases explained with reference to FIG. 3A to FIG. 4. As a result, the region 101c that is the closest to the end portion 101a of the magnetic member 101A cannot be stably and radially magnetized.

The inventors of the present invention have compared the magnetic member 101 according to the first embodiment and the magnetic member 101A according to the comparative example by a simulation. In the first embodiment and the embodiments described later, the ratio of the second face 101f$_2$ in the magnetic member 101 is greater than 0 and less than 1.

Figure 7A:
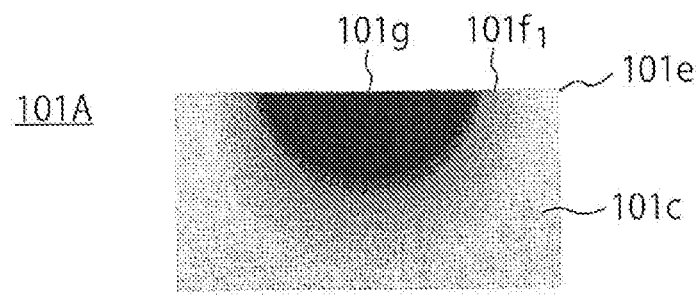
FIG. 7A is a diagram showing a current density distribution when data is written to a magnetic member according to a comparative example.
Figure 7B:
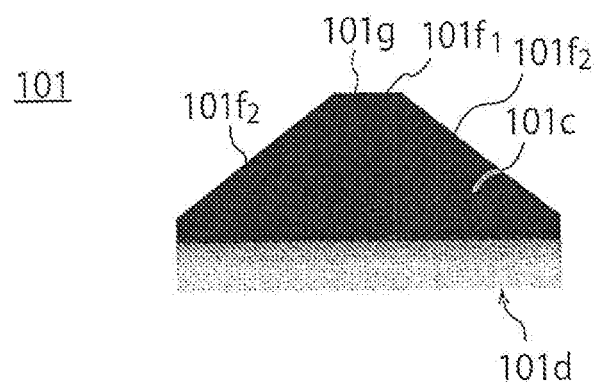
FIG. 7B is a diagram showing a current density distribution when data is written to the magnetic member according to the first embodiment.

FIG. 7A shows a result of a simulation for obtaining a write current density distribution when data is written to the magnetic member 101A of the comparative example shown in FIG. 3A from the write position 101g, and FIG. 7B shows a result of a simulation for obtaining a write current density distribution when data is written to the magnetic member 101 shown in FIG. 1 from the write position 101g. FIGS. 7A and 7B are developments (nets) of the region 101c that is the closest to the write position 101g of the magnetic member 101A and that of the magnetic member 101 respectively, the region 101 being developed around the write position 101g. Dark colored portions indicate higher current densities, and light colored portions indicate lower current densities.

As can be understood from FIG. 7A, in the magnetic member 101A according to the comparative example shown in FIG. 3A, the current density is the highest at the write position 101g and decreases toward the corner portion 101e. This means that the magnetization direction is not controlled in a region around the corner portion 101e.

In contrast, as can be understood from FIG. 7B, in the magnetic member 101 of the first embodiment, the current density increases from the write position 101g toward a lower portion, and decreases toward the narrow portion 101d. This means that the magnetization direction of the region 101c that is the closest to the write position may be controlled easily.

Figure 8A:
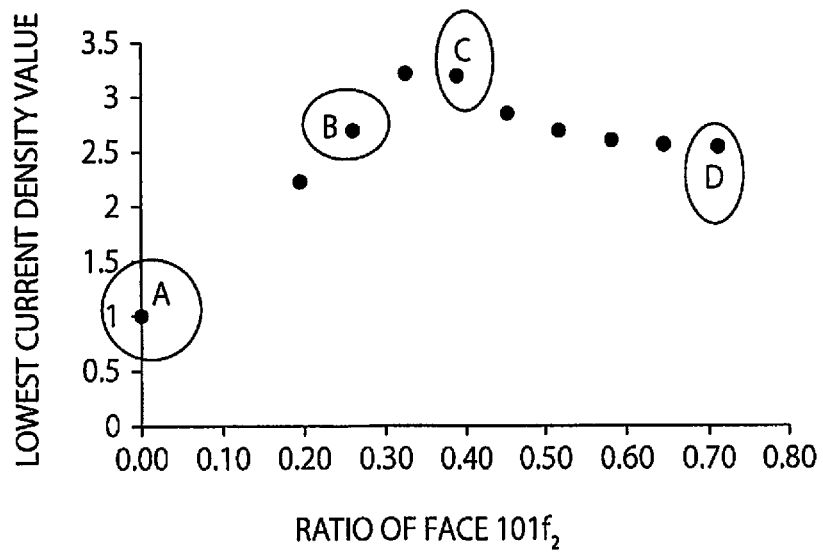
FIG. 8A is a diagram showing the relationship between the lowest value of the current density and the ratio of a second face in the magnetic member according to the first embodiment.
Figure 8B:
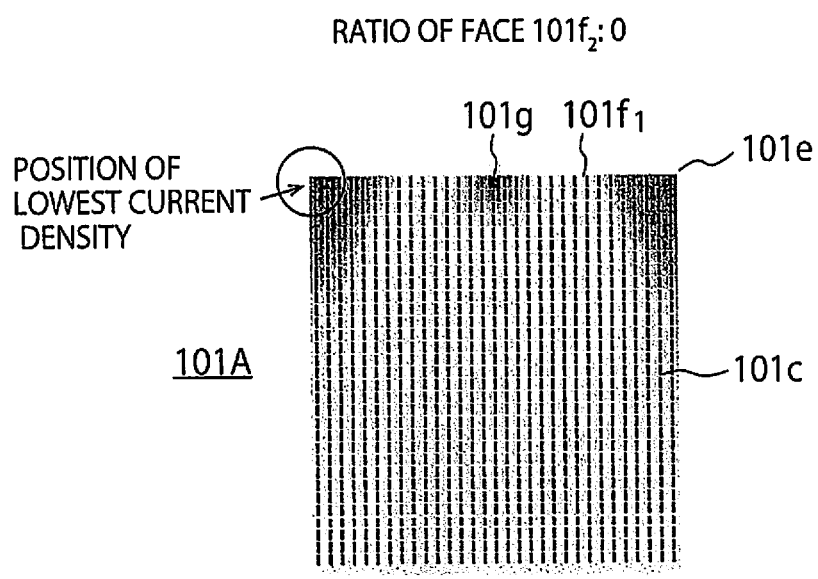
FIG. 8B shows a development of the magnetic member in which the ratio of the second face is 0, the development showing a position where the current density has a lowest value.
Figure 8C:
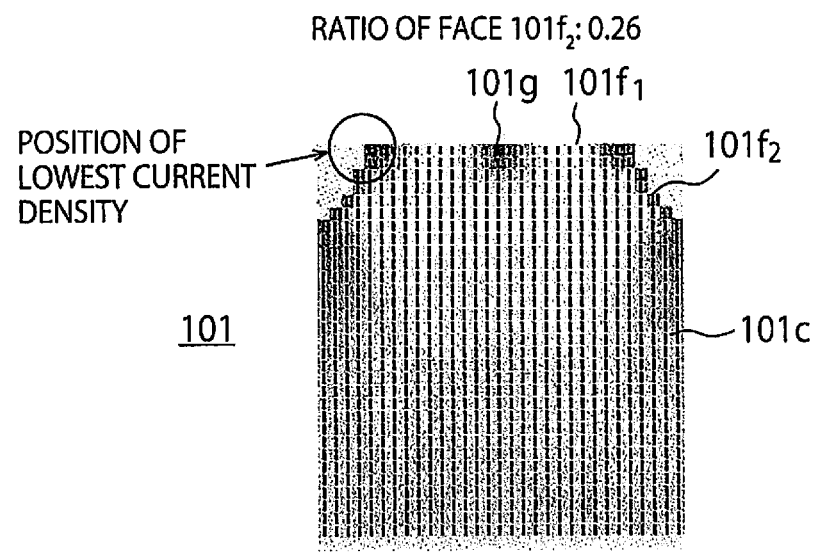
FIG. 8C shows a development of the magnetic member in which the ratio of the second face is 0.26, the development showing a position where the current density has a lowest value.
Figure 8D:
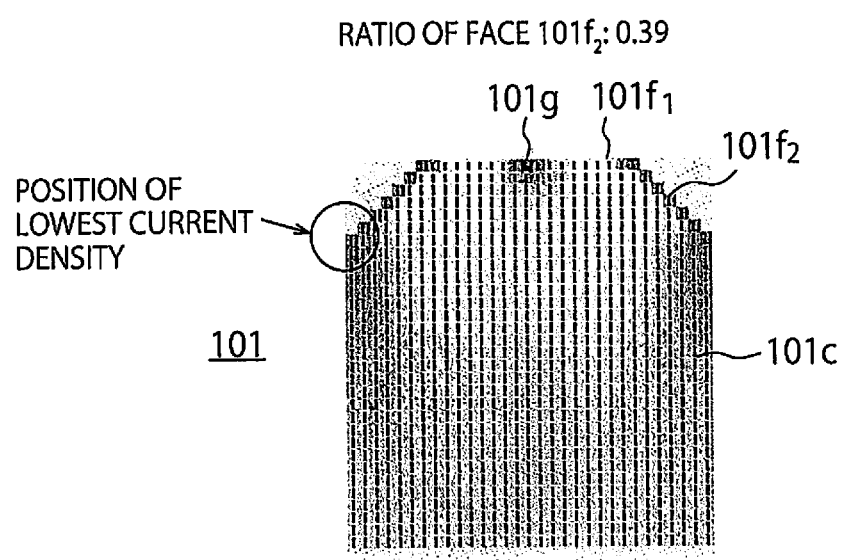
FIG. 8D shows a development of the magnetic member in which the ratio of the second face is 0.39, the development showing a position where the current density has a lowest value.
Figure 8E:
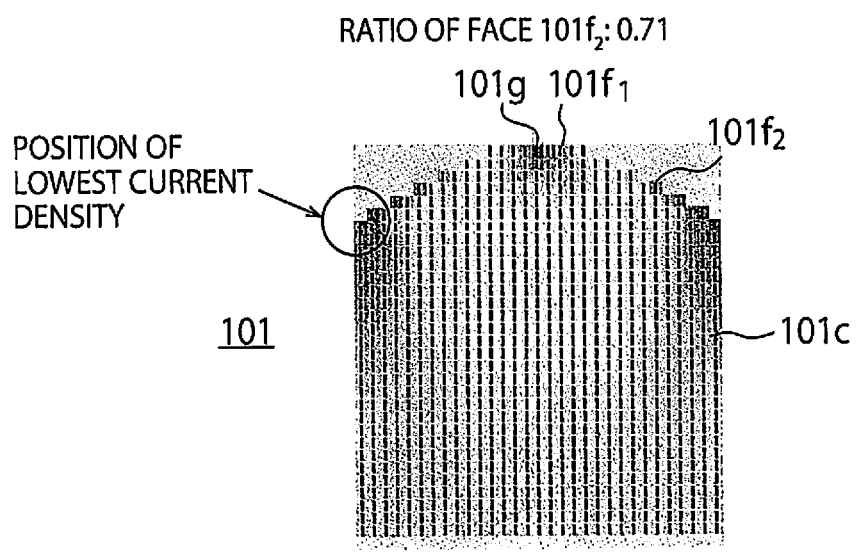
FIG. 8E shows a development of the magnetic member in which the ratio of the second face is 0.71, the development showing a position where the current density has a lowest value.

FIGS. 8A to 8E show results of simulations for obtaining the lowest value of the current density and the position where the lowest value is obtained when the ratio of the second face $101f_2$ in the magnetic member 101 is set to be 0, 0.26, 0.39, and 0.71. FIG. 8A shows the relationship between the lowest value of the current density and the ratio of the second face $101f_2$. In FIG. 8A, the horizontal axis represents the ratio of the second face $101f_2$, and the vertical axis represents the lowest value of the current density. In FIG. 8A, A, B, C, and D indicate the simulated lowest values of the current density in the magnetic member 101 when the ratio of the second face $101f_2$ is 0, 0.26, 0.39, and 0.71, respectively.

Each of FIGS. 8B to 8E is a development of the region 101c around the write position 101g, when the ratio of the second face $101f_2$ is 0, 0.26, 0.39, or 0.71. As can be understood from FIG. 8B, when the ratio of the second face $101f_2$ is 0, the position where the current density is the lowest is at the corner portion 101e of the magnetic member 101A, and therefore located on the same plane as the write position 101g, i.e., on the top face of the end portion 101a. As can be understood from FIGS. 8A to 8E, the lowest value of the current density in the magnetic member 101 having the second face $101f_2$ is greater than that of a magnetic member 101A (FIG. 8B) that does not have the second face $101f_2$. Therefore, the region 101c of the magnetic member 101 that is the closest to the end portion 101a may be stably and radially magnetized. Furthermore, as can be understood from FIG. 8A, the lowest value of the current density becomes high when the ratio of the second face $101f_2$ is 0.3 or more, and decreases if the ratio of the second face $101f_2$ becomes larger than 0.3. Therefore, the ratio of the second face $101f_2$ is preferably 0.3 or more.

It is preferable that a point in the curved line formed by the second face $101f_2$ and the end portion 101a, which point is the closest to the end portion 101b in the z direction, does not reach the narrow portion 101d connecting to the region 101c having the end face 101f. If the point is in the narrow portion 101d, the effect to stop the domain wall at the narrow portion 101d may be weakened, which is undesirable.

In the above descriptions, the end face 101f has the second face $101f_2$ that crosses the z direction and is inclined with respect to a plane that is perpendicular to the z direction, as shown in FIG. 2.

Figure 9A:
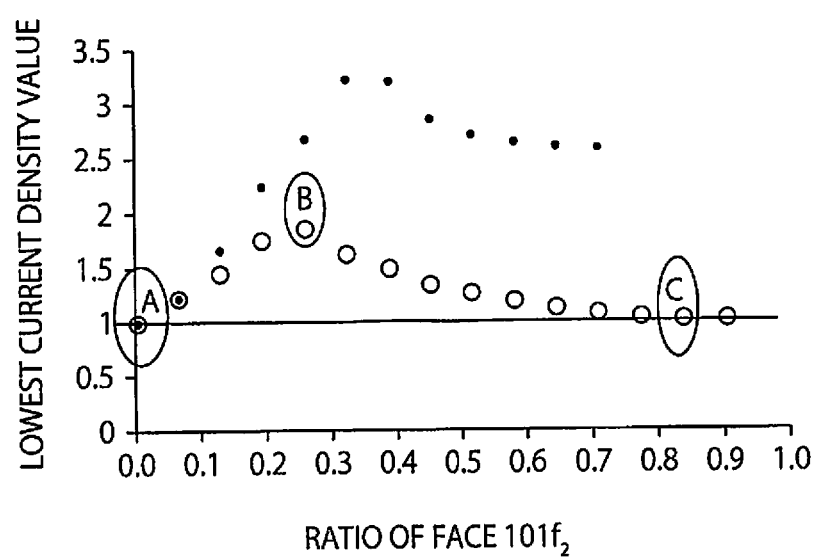
FIG. 9A is a diagram showing the relationship between the lowest value of the current density and the ratio of the second face in a magnetic member in which an end face has a third face.
Figure 9B:
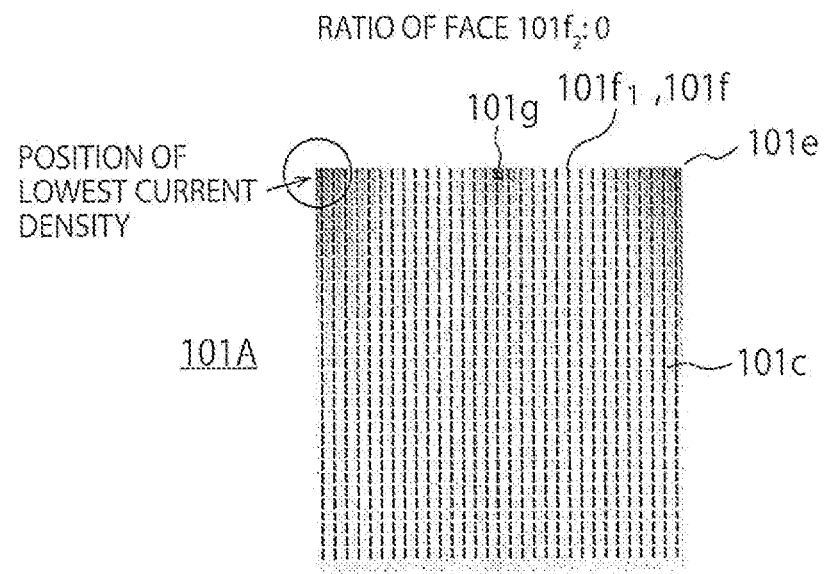
FIG. 9B is a development of the magnetic member in which the ratio of the second face is 0, the development showing a position where the current density has a lowest value.
Figure 9C:
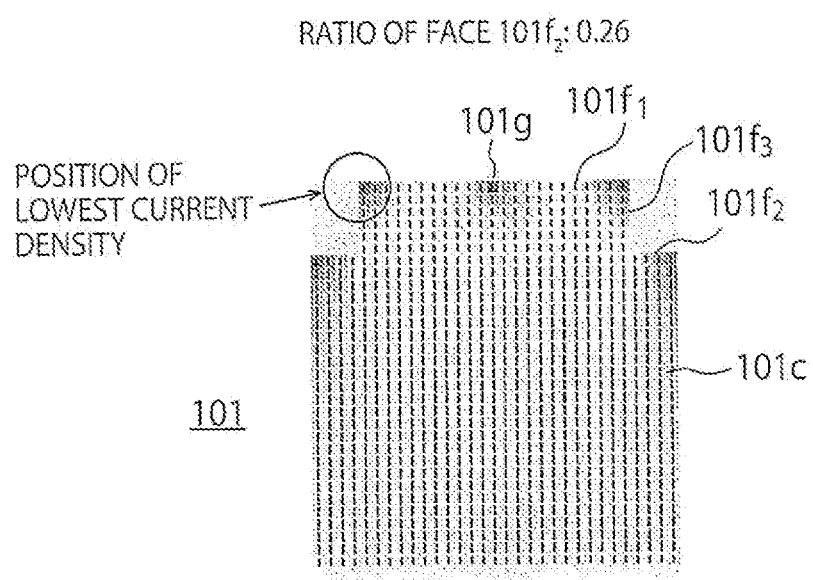
FIG. 9C is a development of the magnetic member in which the end face has the third face and the ratio of the second face is 0.26, the development showing a position where the current density has a lowest value.
Figure 9D:
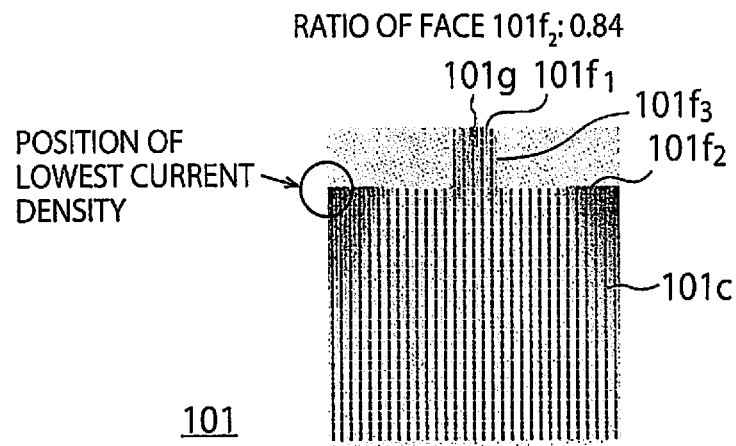
FIG. 9D is a development of the magnetic member in which the end face has the third face and the ratio of the second face is 0.84, the development showing a position where the current density has a lowest value.
Figure 9E:
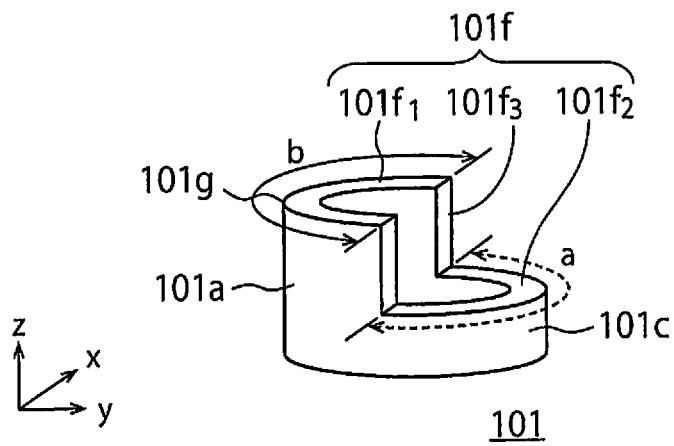
FIG. 9E is a perspective view of a magnetic member having a first face, a second face, and a third face.

In contrast, FIG. 9E shows another example of the magnetic member 101, in which an end face 101f has a first face $101f_1$ that crosses the z direction, a second face $101f_2$ that crosses the z direction at a different position from the first face $101f_1$ in the z direction, and a third face $101f_3$ connecting to the first face $101f_1$ and the second face $101f_2$.

FIGS. 9A to 9D show results of a simulation for obtaining the lowest value of the current density and the position where the lowest value is obtained in the magnetic member 101 shown in FIG. 9E. For example, the first face $101f_1$ crosses the z direction at right angle, the second face $101f_2$ crosses the z direction at right angle, and the third face $101f_3$ is parallel to the z direction.

FIG. 9A shows the relationship between the lowest value of the current density and the ratio of the second face $101f_2$ with respect to the end face 101f ("the ratio of the second face $101f_2$"). As in the case of FIG. 2, the ratio of the second face $101f_2$ is obtained by dividing a length of an outer arc of the second face $101f_2$ projected on a plane that is perpendicular to the z direction (represented by a broken line a) by a sum of a length of an outer arc of the first face $101f_1$ projected on a plane that is perpendicular to the z direction (represented by a solid line b) and the length of the broken line a (=a+b) (FIG. 9E). In other words, the ratio of the second face $101f_2$ is a/(a+b).

In FIG. 9A, the horizontal axis represents the ratio of the second face $101f_2$, and the vertical axis represents the lowest value of the current density. In FIG. 9A, A, B, and C indicate the simulated lowest values of the current density in the magnetic member 101 when the ratio of the second face $101f_2$ is 0, 0.26, and 0.84. Furthermore, black circles in FIG. 9A indicate cases where the end face 101f has a first face $101f_1$ and a second face $101f_2$ but does not have a third face $101f_3$ (for example, the case shown in FIG. 2), and white circles indicate cases where the end face 101f has the first face $101f_1$, the second face $101f_2$, and the third face $101f_3$ (for example, the case shown in FIG. 9E).

In the magnetic member 101 having the end face 101f with the first face $101f_1$, the second face $101f_2$, and the third face $101f_3$ (see FIG. 9E), the third face $101f_3$ is parallel to the z direction. Therefore, the cross-sectional area of a first portion obtained by cutting the end portion 101a by a first plane that is perpendicular to the z direction (for example, a portion near the first face $101f_1$ in FIG. 9E) is the same as the cross-sectional area of a second portion obtained by cutting the end portion 101a by a second plane that is perpendicular to the z direction (for example, a portion near the second face $101f_2$ in FIG. 9E). The first portion is more distant from the end portion 101b of the magnetic member 101 than the second portion is when viewed in the z direction.

Each of FIGS. 9B to 9D is a development of the region 101c around the write position 101g, when the ratio of the second face $101f_2$ is 0, 0.26, or 0.84. As can be understood from FIGS. 9A and 9B, when the ratio of the second face $101f_2$ is 0, the position where the current density is the lowest is at the corner portion 101e of the magnetic member 101A, and therefore located on the same plane as the write position 101g, i.e., on the end face 101f of the end portion 101a. As can be understood from FIGS. 9A, 9C and 9D, the lowest value of the current density in the magnetic member 101 in which the end face 101f has the third face $101f_3$ is greater than the magnetic member 101A in which the end face 101f does not have the third face $101f_3$. Therefore, the region 101c of the magnetic member 101 that is the closest to the end portion 101a may be stably and radially magnetized.

The lowest value of the current density in the magnetic member 101 in which the end face 101f has the third face 101$f_3$ (the magnetic member shown in FIG. 9C) is greater than the magnetic member 101A in which the end face 101f does not have the third face 101$f_3$ (for example, the magnetic member shown in FIGS. 9A and 9B). Therefore, the region 101c of the magnetic member 101 that is the closest to the end portion 101a may be stably and radially magnetized.

Furthermore, as can be understood from FIG. 9A, the lowest value of the current density of the magnetic member 101 shown in FIG. 9E, for example, is smaller than that of the magnetic member 101 shown in FIG. 2, for example. Therefore, the magnetic member 101 shown in FIG. 2, which has the end face 101f having the second face 101$f_2$ that crosses the z direction and is inclined with respect to a plane that is perpendicular to the z direction, for example, is more preferable. Further, as can be understood from FIG. 9A, if the ratio of the second face 101$f_2$ exceeds 0.8, the lowest value of the current density becomes the same as that in the case of the magnetic member 101A shown in FIG. 9B, which does not have the third face 101$f_3$ and in which the ratio of the second face 101$f_2$ is 0. Therefore, the region 101c that is the closest to the end portion 101a cannot be stably and radially magnetized. Because of the foregoing, the ratio of the second face 101$f_2$ is preferably 0.3 or more and 0.8 or less.

Figure 10A:
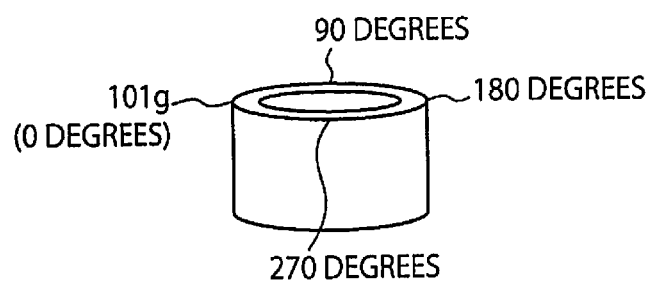
FIG. 10A is a perspective view for explaining the position of the third face.

Next, current density distributions are obtained by simulations with the position of the third face 101$f_3$ being changed. Simulations are made for cases where the position of the third face 101$f_3$ is the same as the write position 101g (0 degrees), and at 90 degrees, 180 degrees, and 270 degrees with respect to the write position 101g, as shown in FIG. 10A. The third face 101$f_3$ has a depth not reaching the narrow portion 101d that is the closest to the write position.

Figure 10B:
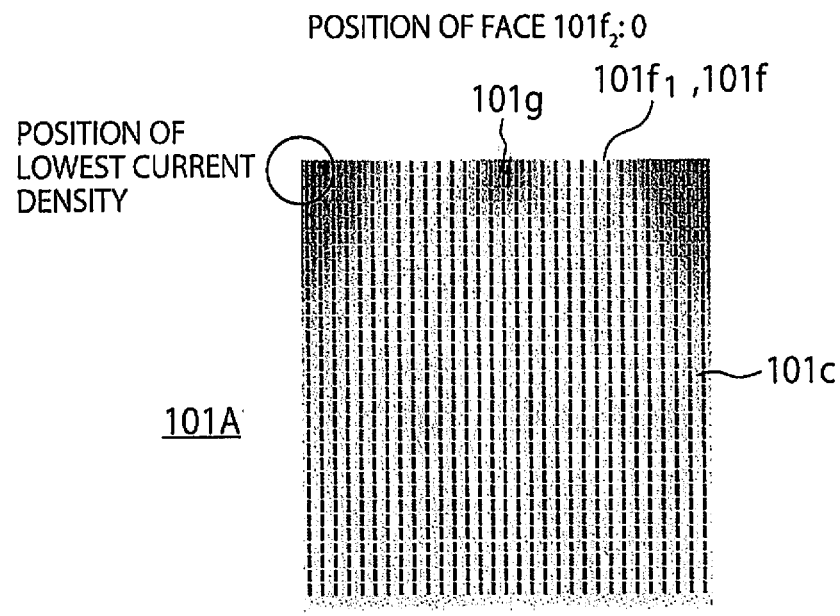
FIG. 10B is a development of a magnetic member in which the ratio of the second face is 0, the development showing a position where the current density has a lowest value.
Figure 10C:
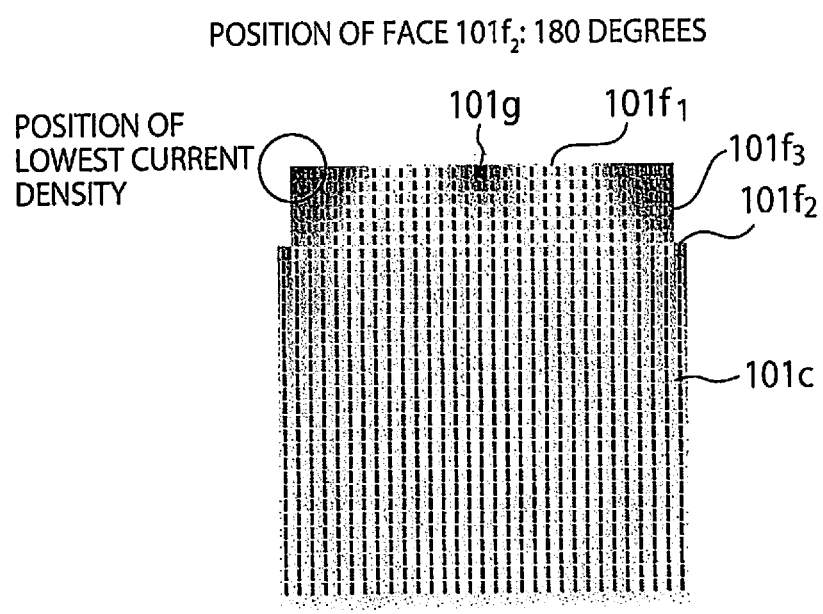
FIG. 10C is a development of a magnetic member in which the position of the third face is at 180 degrees, the development showing a position where the current density has a lowest value.
Figure 10D:
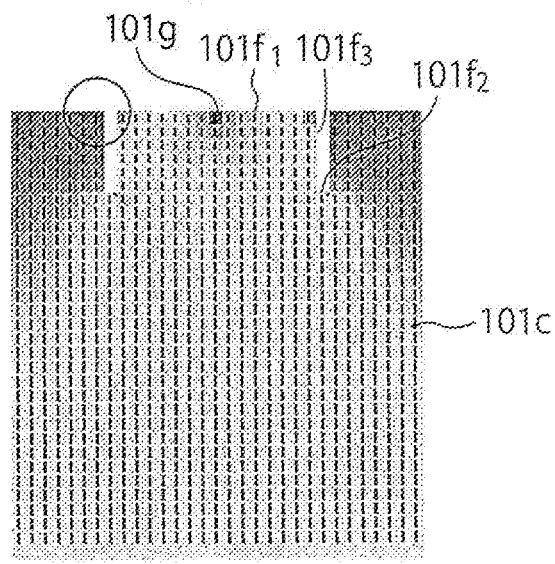
FIG. 10D is a development of a magnetic member in which the position of the third face is at 90 degrees and 270 degrees, the development showing a position where the current density has a lowest value.
Figure 10E:
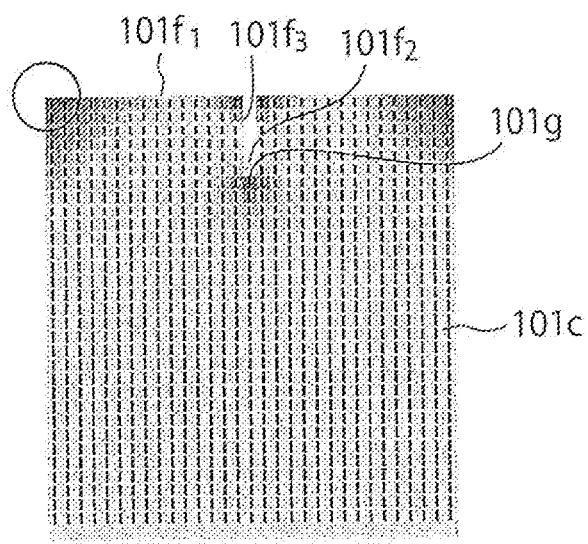
FIG. 10E is a development of a magnetic member in which the position of the third face is at 0 degrees, the development showing a position where the current density has a lowest value.

Each of FIGS. 10B to 10E is a development of the region 101c around the write position 101g. FIG. 10B shows a case where the end face 101f does not have the second face 101$f_2$ and the third face 101$f_3$, FIG. 10C shows a case where the third face 101$f_3$ is at 180 degrees, FIG. 10D shows a case where the third face 101$f_3$ is at 90 degrees and 270 degrees, and FIG. 10E shows a case where the third face 101$f_3$ is at 0 degrees.

If the value of the lowest current density of the magnetic member shown in FIG. 10B, in which the end face 101f does not have the second face 101$f_2$ and the third face 101$f_3$, is 1, the value of the lowest current density of the magnetic member shown in FIG. 10C is 1.22, that of the magnetic member shown in FIG. 10D is 0.18, and that of the magnetic member shown in FIG. 10E is 0.71. The circled portions in FIGS. 10B to 10E indicate positions where the current density is the lowest.

As can be understood from the case shown in FIG. 10C, if the third face 101$f_3$ is located at 180 degrees, which is on the opposite side to the write position 101g, the lowest current density is 1.22 and greater than the lowest current density in the case shown in FIG. 10B (where the lowest current density is 1). However, as can be understood from the cases shown in FIGS. 10D and 10E, if the third face 101$f_3$ is at 90 degrees, 270 degrees, and 0 degrees, the lowest current density is smaller than that in the case shown in FIG. 10B. Therefore, the position of the third face 101$f_3$ is preferably opposite to the write position 101g with respect to the z direction.

As described above, the magnetic memory according to the first embodiment is capable of performing a write operation in which part of a magnetic member may be stably and radially magnetized.

Second Embodiment

Figure 11:
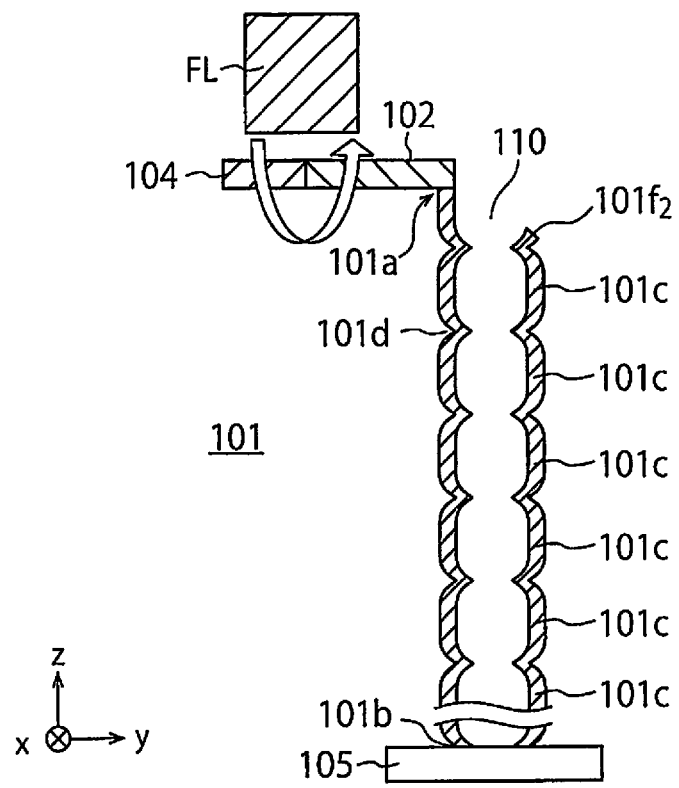
FIG. 11 is a cross-sectional view of a magnetic memory according to a second embodiment.

FIG. 11 shows a magnetic memory according to a second embodiment. The magnetic memory according to the second embodiment is obtained by replacing the magnetoresistive element 103 with a field line FL in the magnetic memory according to the first embodiment shown in FIG. 1. A write operation to write data to the magnetic layer 102 using the field line FL is performed in the same manner as the write operation described with reference to FIG. 5. Since the magnetic memory according to the second embodiment includes the magnetic member 101, which is the same as that of the first embodiment, a write operation may be performed to stably and radially magnetize an end of the magnetic member. Also in this embodiment, a magnetoresistive element 103 for a read operation may be disposed on the magnetic layer 102.

(Manufacturing Method)

A method of manufacturing the magnetic memory according to the second embodiment will be described with reference to FIGS. 12A to 12G.

Figure 12A:
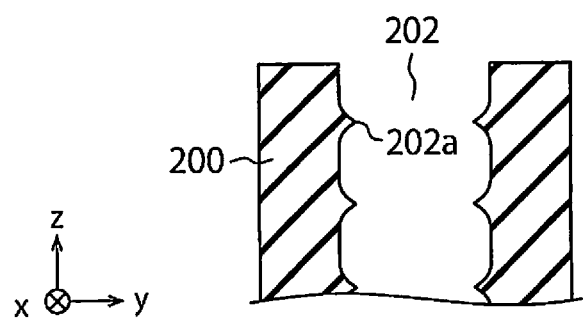
FIGS. 12A to 12G are cross-sectional views showing a process of manufacturing the magnetic memory according to the second embodiment.

First, as shown in FIG. 12A, a substrate 200 of aluminum is prepared and anodized. During the anodization, a current is caused to flow through an electrolytic solution (for example, any of or a mixture of a sulfuric acid, an oxalic acid, and a phosphoric acid) with the substrate 200 being used as an anode. The metal (aluminum) of the anode is oxidized to release metal ions and dissolved. The metal ions are bonded with oxygen in the solution to make a metal oxide (alumina), and remain and grow on the face of the anode metal. Since the dissolving and the growing advance simultaneously, a minute hole 202 of alumina is formed on the face of the anode 200 of aluminum. While the hole 202 is being formed, in addition to a first voltage used to form the hole, a second voltage that is different from the first voltage is periodically applied. While the second voltage is being applied, portions 202a having a smaller size (diameter) in the y direction are formed. The material of the region in which the hole 202 is formed is changed from aluminum to alumina.

Figure 12B:
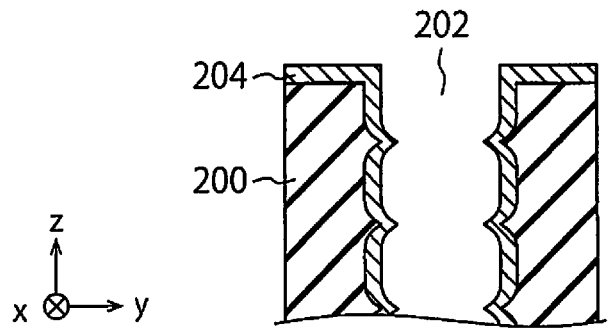
Figure 12C:
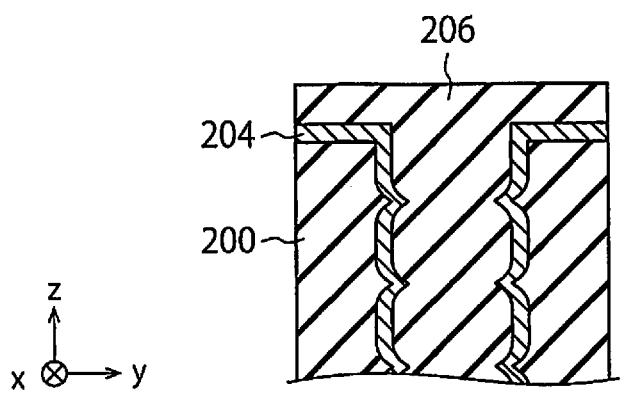

Subsequently, as shown in FIG. 12B, a magnetic layer 204 is formed to cover an inner face of the hole 202 and a top face of the alumina 200. Thereafter, as shown in FIG. 12C, an insulating film 206 of a nonmagnetic material is formed to be filled into the hole 202 and to cover the top face of the alumina 200. The face of the insulating film 206 is then smoothed by chemical mechanical polishing (CMP), for example, to form an insulating film 206a.

Figure 12D:
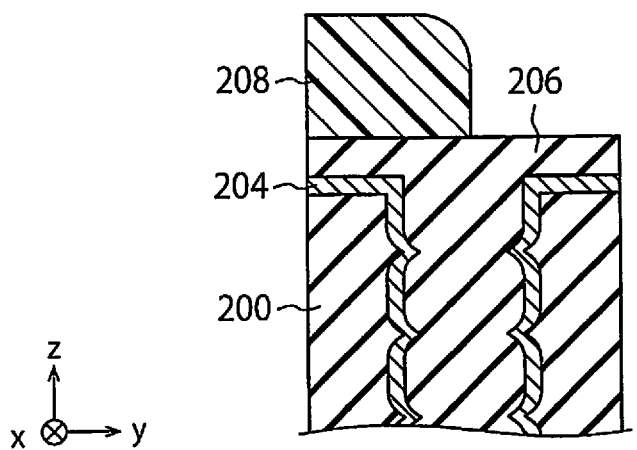
Figure 12E:
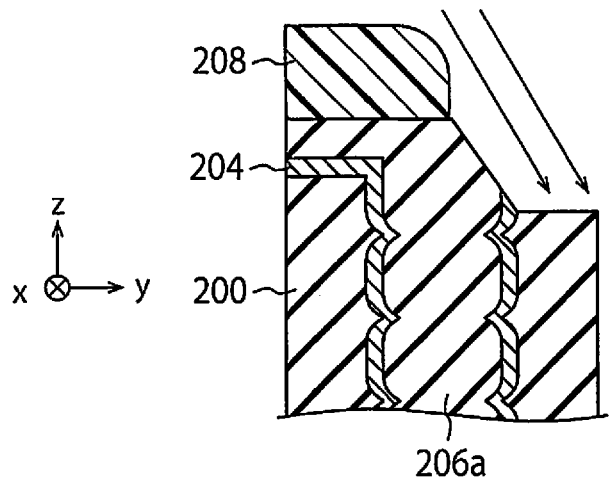

Next, as shown in FIG. 12D, a mask 208 of a photosensitive resin is formed to cover a portion of the hole 202. Subsequently, as shown in FIG. 12E, an exposed part of the insulating film 206a, a part of the magnetic layer 204, and a part of the alumina 200 are diagonally removed by milling. After this process, the magnetic layer 204 becomes a magnetic member 101. Thereafter, the mask 208 is removed (FIG. 12F), and a field line FL is formed above the region of the insulating film 206 from which the mask 208 is removed (FIG. 12G).

Figure 12F:
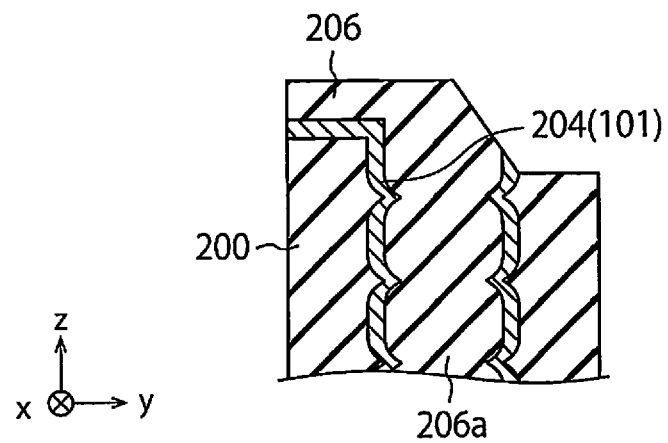
Figure 12G:
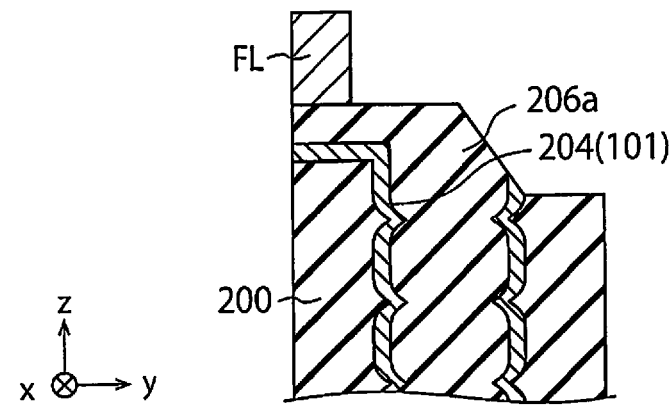

The magnetic memory according to the first embodiment shown in FIG. 1 is formed through the same procedure until the step shown in FIG. 12F, and then the insulating film 206 remaining on the magnetic layer 204 is removed and a magnetoresistive element 103 is formed on the magnetic layer 204 on the top face of the alumina 200.

Third Embodiment

Figure 13:
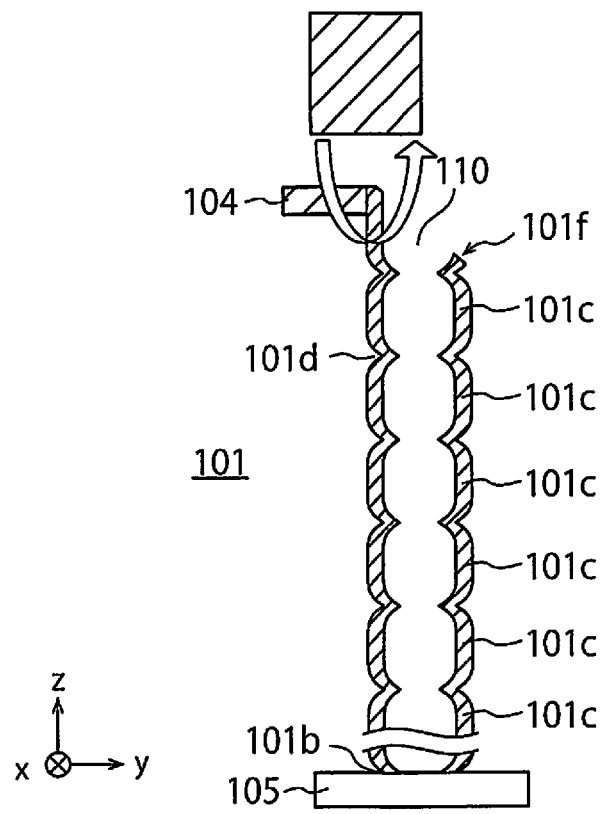
FIG. 13 is a cross-sectional view of a magnetic memory according to a third embodiment.

FIG. 13 shows a magnetic memory according to a third embodiment. The magnetic memory according to the third embodiment is obtained by removing the magnetic layer 102 from the magnetic memory according to the second embodiment shown in FIG. 11, and the electrode 104 is directly connected to the magnetic member 101. In this case, the field line FL is disposed in the vicinity of the uppermost region 101c of the magnetic member 101. A write operation of the magnetic memory according to the third embodiment is performed in the same manner as that of the magnetic memory shown in FIG. 6.

The magnetic memory according to the third embodiment, which includes the magnetic member 101 that is the same as the magnetic member 101 of the first embodiment, is capable of performing a write operation in which part of the magnetic member may be stably and radially magnetized.

Fourth Embodiment

Figure 14A:
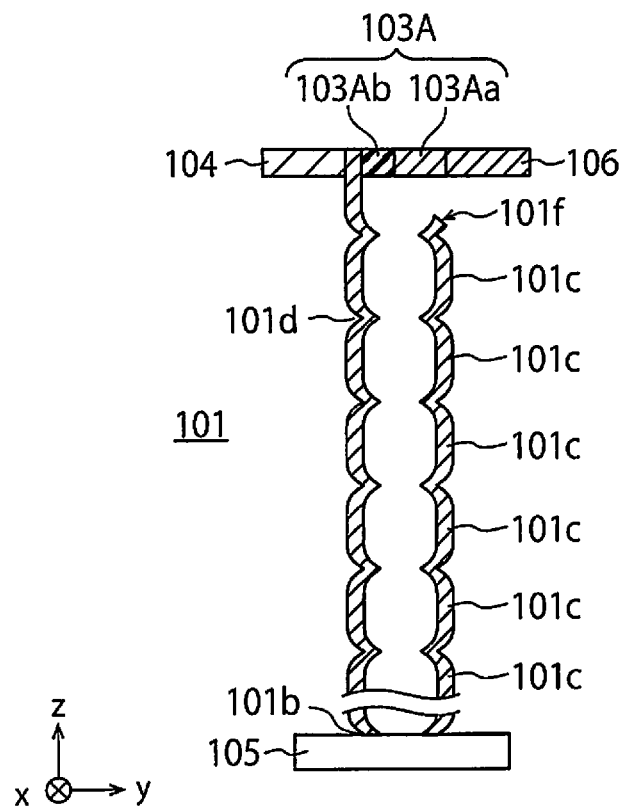
FIG. 14A is a cross-sectional view of a magnetic memory according to a fourth embodiment.
Figure 14B:
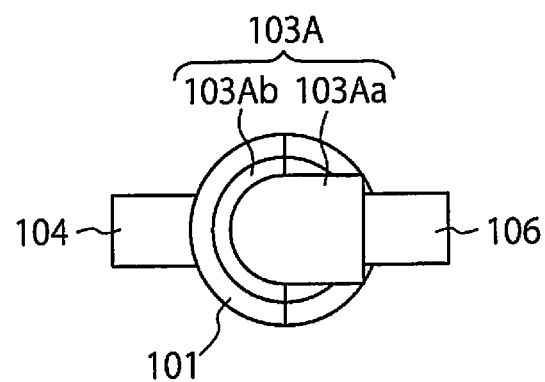
FIG. 14B is a top view of the magnetic memory according to the fourth embodiment.

A magnetic memory according to a fourth embodiment will be described with reference to FIGS. 14A and 14B. FIG. 14A is a cross-sectional view and FIG. 14B is a top view of the magnetic memory according to the fourth embodiment.

The magnetic memory according to the fourth embodiment has a configuration obtained by replacing the field line FL with a magnetoresistive element (for example, an MTJ element) 103A in the magnetic memory according to the third embodiment shown in FIG. 13. The magnetoresistive element 103A includes a magnetization fixed layer 103Aa disposed on an opposite side to an inner wall (inner face) of the magnetic member 103A to which the electrode 104 is connected, and a nonmagnetic insulating layer 103Ab disposed between the magnetization fixed layer 103Aa and the inner face of the magnetic member 103A. The magnetization fixed layer 103Aa is electrically connected to the third electrode 106.

A write operation of the magnetic memory according to the fourth embodiment is performed by using the magnetoresistive element 103A to write information (magnetization direction) to a region of the magnetic member 101 to which the magnetoresistive element 103A is connected. A read operation is performed by using a read element (not shown) disposed near a region 101c of the magnetic member 101. A read operation in the second and the third embodiment is performed in the same manner as that in the fourth embodiment.

Since the magnetic memory according to the fourth embodiment includes the magnetic member 101, which is the same as that of the first embodiment, the magnetic memory is capable of performing a write operation in which a part of the magnetic member may be stably and radially magnetized.

Figure 15A:
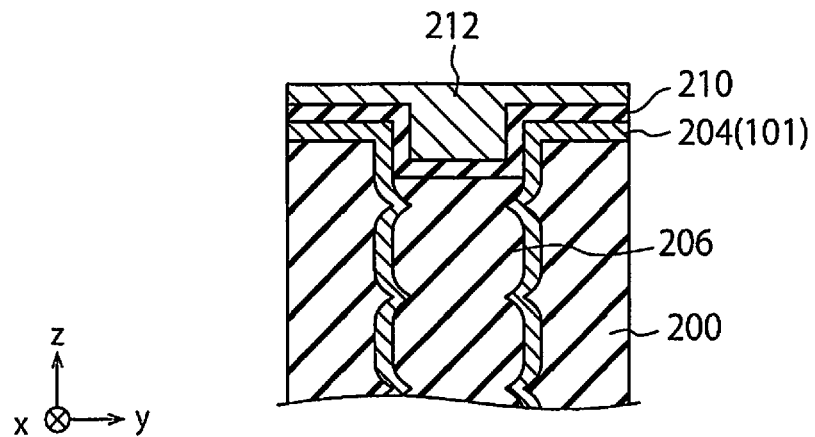
FIG. 15A is a cross-sectional view showing a step of a first manufacturing method for manufacturing the magnetic memory according to the fourth embodiment.

Next, a first manufacturing method for manufacturing the magnetic memory according to the fourth embodiment will be described with reference to FIGS. 15A to 15C. FIG. 15A is a cross-sectional view of a step of the first manufacturing method, and FIG. 15B and FIG. 15C are plan views of steps of the first manufacturing method.

First, the method of manufacturing the magnetic memory according to the second embodiment is performed until the step shown in FIG. 12C. Thereafter, the insulating film 206 is etched and removed until the face of the magnetic layer 204 is exposed. Subsequently, a part of the insulating film 206 filled in the hole 202 (see FIG. 12C) is etched and removed to form a recessed portion. The insulating layer 210 to become the nonmagnetic insulating layer of the magnetoresistive element 103A is then formed to cover the bottom and the side of the recessed portion. The magnetic layer 212 to become the magnetization fixed layer is formed to cover the insulating layer 210 as shown in FIG. 15A.

Figure 15B:
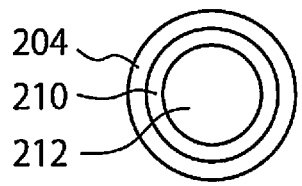
FIG. 15B is a top view showing a step of the first manufacturing method for manufacturing the magnetic memory according to the fourth embodiment.
Figure 15C:
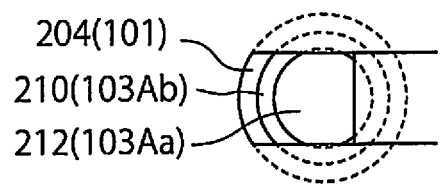
FIG. 15C is a top view showing a step of the first manufacturing method for manufacturing the magnetic memory according to the fourth embodiment.

The magnetic layer 212, which will become the magnetization fixed layer, and the insulating layer 210 are then partially removed by CMP, for example, to expose the face of the magnetic layer 204 (FIG. 15B). Thereafter, the magnetic layer 204, the nonmagnetic insulating layer 210, and the magnetic layer 212 are partially etched (FIG. 15C). As a result, the magnetic layer 204 becomes the magnetic member 101, a part of which is removed (notch structure), and the nonmagnetic insulating layer 210 becomes the nonmagnetic insulating layer 103Ab of the magnetoresistive element 103A. The magnetization of the magnetic layer 212 is then fixed, resulting in that the magnetic layer 212 becomes the magnetization fixed layer 103Aa of the magnetoresistive element 103A. Thereafter, a third electrode 106 (not shown), which is electrically connected to the magnetization fixed layer 103Aa (see FIG. 14A), is formed.

Next, a second manufacturing method for manufacturing the magnetic memory according to the fourth embodiment will be described with reference to FIGS. 16A to 16C, which are plan views of steps of the second manufacturing method.

Figure 16A:
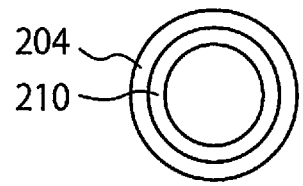
FIGS. 16A to 16C are plan views showing steps of a second manufacturing method for manufacturing the magnetic memory according to the fourth embodiment.
Figure 16B:
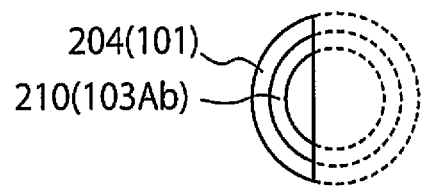
Figure 16C:
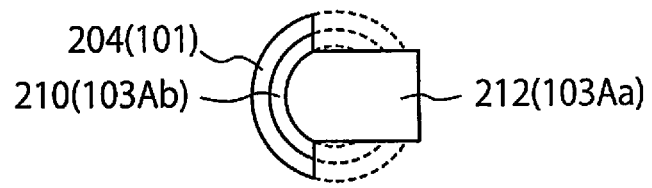

First, the nonmagnetic insulating layer 210 is formed on the inner wall of the magnetic layer 204 to become the magnetic member 101 (FIG. 16A). Subsequently, a part of the magnetic layer 204 is removed (notch process). The nonmagnetic insulating layer 210 is also processed at this time. As a result, the magnetic layer 204 becomes the magnetic member 101, and the nonmagnetic insulating layer 210 becomes the nonmagnetic insulating layer 103Ab of the magnetoresistive element 103A (FIG. 16B). Thereafter, the magnetic layer 212 connecting to the nonmagnetic insulating layer 103Ab is formed, and the magnetization direction of the magnetic layer 212 is fixed, resulting in that the magnetic layer 212 becomes the magnetization fixed layer 103Aa of the magnetoresistive element 103A.

In the above descriptions of the magnetic memories according to the first to fourth embodiments, there is only one magnetic member 101. However, normally there are multiple magnetic members 101A. An example of a layout of a magnetic memory including multiple magnetic members 101 will be described with reference to FIGS. 17A to 17D.

First Example

Figure 17A:
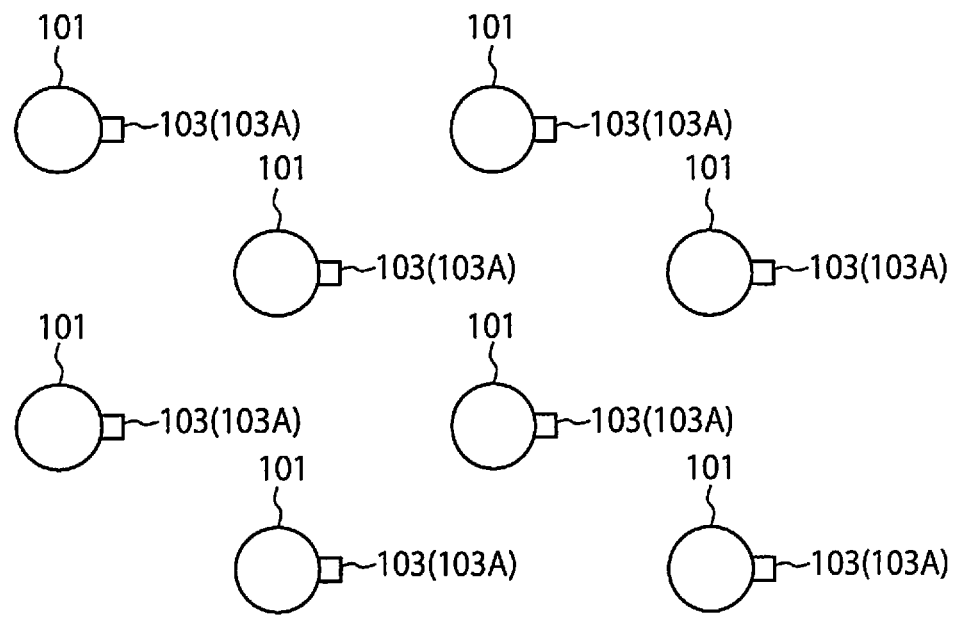
FIGS. 17A to 17D are plan views showing examples of a layout of a magnetic memory.

FIG. 17A shows a first example of a layout of such a magnetic memory. In the first example, the magnetic members 101 are arranged to have a hexagonal close-packed structure (planar structure). Specifically, in the planar structure, each of a magnetic member 101 arranged in a second row is between two magnetic members 101 arranged in a first row, each of the magnetic members 101 arranged in a third row is between two magnetic members 101 arranged in the second row, each of the magnetic members 101 arranged in a second column is between two magnetic members 101 arranged in a first column, and each of the magnetic members 101 arranged in a third column is between two magnetic members 101 arranged in the second column. Such an arrangement of the magnetic member 101 enables the manufacture of a magnetic memory with a minimum footprint.

Each of the magnetic members 101 includes the magnetoresistive element 103 or the magnetoresistive element 103A of the magnetic memory according to the first embodiment or the fourth embodiment, for example. The magnetoresistive element 103 or the magnetoresistive element 103A is disposed on one side (right side in FIG. 17A) of each magnetic member 101A.

Second Example

Figure 17B:
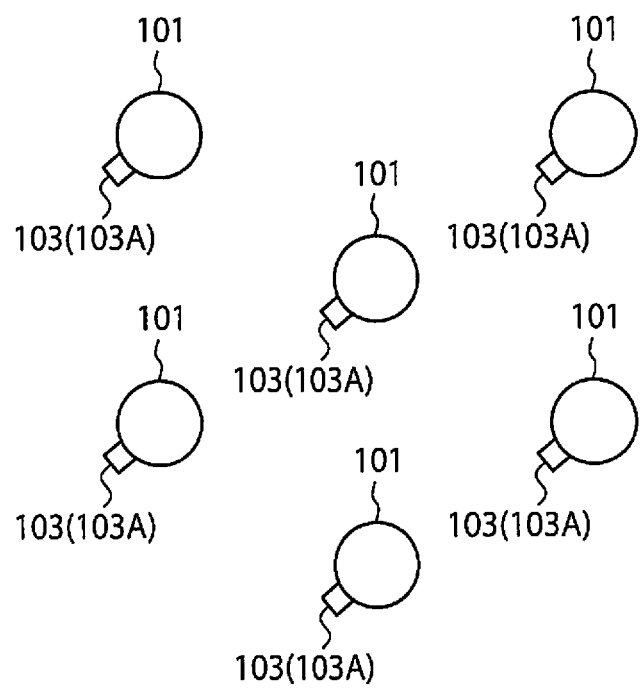

FIG. 17B shows a second example of a layout of a magnetic memory. In the second example, the magnetic members 101 are arranged to have the same hexagonal close-packed structure (planar structure) as those of the first example shown in FIG. 17A, but the magnetoresistive elements 103 or the magnetoresistive elements 103A are arranged in a diagonal direction (that crosses the row direction and the column direction in FIG. 17B). The arrangement of the second example also enables the manufacture of a magnetic memory with a minimum footprint.

Third Example

Figure 17C:
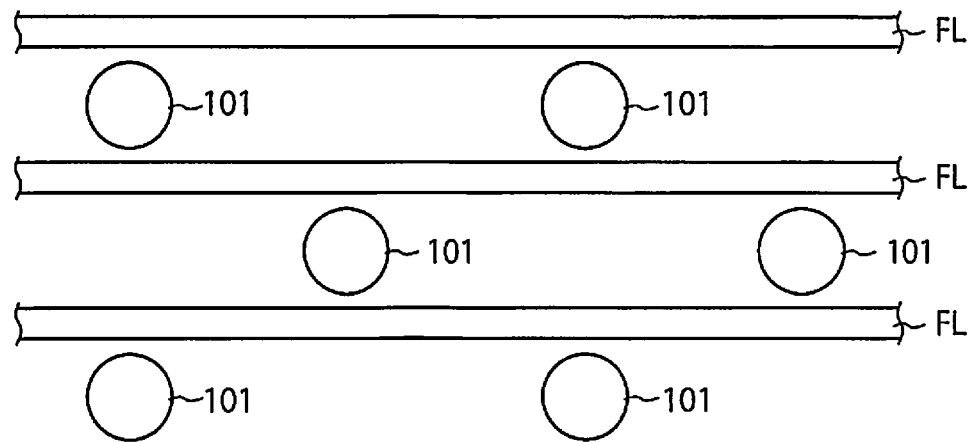

FIG. 17C shows a third example of a layout of a magnetic memory. The third example may apply to the magnetic memories according to the second and the third embodiments. The magnetic members 101 are arranged to have the hexagonal close-packed structure (planar structure), like those of the first example shown in FIG. 17A. A field line FL is shared by the magnetic members 101 arranged in the same row. Although each field line FL is disposed for the magnetic members 101 arranged in the same row in the third example, it may be shared by the magnetic members 101 arranged in the same column, or the same diagonal line. The arrangement of the third example also enables the manufacture of a magnetic memory with a minimum footprint.

Fourth Example

Figure 17D:
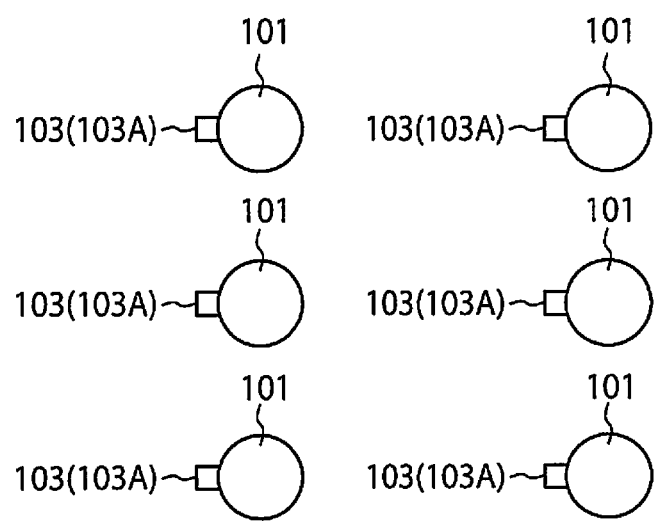

FIG. 17D shows a fourth example of a layout of a magnetic memory. In the fourth example, the magnetic members 101A are arranged in a matrix form. The magnetoresistive element 103 or the magnetoresistive element 103A is disposed on one side (left side in FIG. 17D) of each magnetic member 101. The magnetoresistive elements 103 or the magnetoresistive elements 103A may be diagonally disposed as in the case of FIG. 17B. In addition to the magnetoresistive elements 103 or the magnetoresistive elements 103A, or instead of the magnetoresistive elements 103 or the magnetoresistive elements 103A, a field line FL may be provided. In this case, the field line FL may be shared by the magnetic members 101 arranged in the same row as in the case of FIG. 17C, or shared by the magnetic members 101 arranged in the same diagonal line.

As described above, the magnetic memory according to each embodiment of the present invention is capable of performing a write operation in which a part of the magnetic member is stably and radially magnetized.

While certain embodiments have been described, these embodiments have been presented by way of example only, and are not intended to limit the scope of the inventions. Indeed, the novel methods and systems described herein may be embodied in a variety of other forms; furthermore, various omissions, substitutions and changes in the form of the methods and systems described herein may be made without departing from the spirit of the inventions. The accompanying claims and their equivalents are intended to cover such forms or modifications as would fall within the scope and spirit of the inventions.

The invention claimed is:

1. A magnetic memory comprising:
a magnetic member having a cylindrical form extending in a first direction along a central axis of the magnetic member and having an inside surface and an outside surface, the magnetic member including a first end portion and a second end portion opposite to the first end portion in the first direction, the first end portion having an end face, which includes a face inclined with respect to a plane perpendicular to the first direction, the face of the end face crossing the outside surface and the inside surface;
a nonmagnetic insulating material extending in the first direction, and being provided in the cylindrical form of the magnetic member and being surrounded by the inside surface of the first end portion;
a first electrode electrically connected to the first end portion; and
a second electrode electrically connected to the second end portion.

2. The magnetic memory according to claim 1, wherein the first end portion includes a first portion and a second portion that is closer to the second end portion than the first portion in the first direction, a first cross-sectional area of the first portion in a plane that is perpendicular to the first direction being smaller than a second cross-sectional area of the second portion in a plane perpendicular to the first direction.

3. The magnetic memory according to claim 2, wherein the first end portion includes a part, a cross-sectional area of the part in a plane perpendicular to the first direction being constant along the first direction from the first portion to the second portion.

4. The magnetic memory according to claim 2, wherein the first end portion includes a part, a cross-sectional area of the part in a plane perpendicular to the first direction increasing along the first direction from the first portion to the second portion.

5. The magnetic memory according to claim 1 further comprising:
a first magnetic layer extending in a second direction that crosses the first direction, the first magnetic layer being connected to the first end portion;
a second magnetic layer disposed to face at least part of the first magnetic layer; and
a nonmagnetic layer disposed between the at least part of first magnetic layer and the second magnetic layer.

6. The magnetic memory according to claim 1, further comprising:
a magnetic layer extending in a second direction that crosses the first direction, the magnetic layer being connected to the first end portion; and
a field line that writes information to the magnetic layer.

7. The magnetic memory according to claim 1, further comprising:
a magnetic layer disposed to face an inner face of the first end portion; and
a nonmagnetic layer disposed between the magnetic layer and the inner face of the first end portion.

8. The magnetic memory according to claim 1, further comprising a field line that writes information to the first end portion.

9. The magnetic memory according to claim 5, further comprising:
 a circuit configured to supply a current to the magnetic member via the first electrode and the second electrode,
 wherein the first electrode is electrically connected to one of the first magnetic layer and the second magnetic layer.

10. The magnetic memory according to claim 1, further comprising a circuit electrically connected to the first electrode and the second electrode, the circuit configured to supply a current to the magnetic member via the first electrode and the second electrode to move a domain wall in the magnetic member.

11. A magnetic memory comprising:
 a magnetic member having a cylindrical form extending in a first direction along a central axis of the magnetic member and having an inside surface and an outside surface, the magnetic member including a first end portion and a second end portion opposite to the first end portion in the first direction, the first end portion having an end face, which includes a first face that crosses the first direction and a second face that is different from the first face, the second face crossing the first direction and the first and second faces crossing the outside surface and the inside surface;
 a nonmagnetic insulating material extending in the first direction, and being provided in the cylindrical form of the magnetic member and being surrounded by the inside surface of the first end portion;
 a first electrode electrically connected to the first end portion; and
 a second electrode electrically connected to the second end portion.

12. The magnetic memory according to claim 11, wherein the first face and the second face are connected to each other, and an angle at which the first face crosses the first direction is different from an angle at which the second face crosses the first direction.

13. The magnetic memory according to claim 11, wherein the first end portion includes a first portion and a second portion that is closer to the second end portion than the first portion in the first direction, a first cross-sectional area of the first portion in a plane perpendicular to the first direction being smaller than a second cross-sectional area of the second portion in a plane perpendicular to the first direction.

14. The magnetic memory according to claim 13, wherein the first end portion includes a part, a cross-sectional area of the part in a plane perpendicular to the first direction being constant along the first direction from the first portion to the second portion.

15. The magnetic memory according to claim 13, wherein the first end portion includes a part, a cross-sectional area of the part in a plane perpendicular to the first direction increasing along the first direction from the first portion to the second portion.

16. The magnetic memory according to claim 11, further comprising:
 a magnetic layer disposed to face an inner face of the first end portion; and
 a nonmagnetic layer disposed between the magnetic layer and the inner face of the first end portion.

17. The magnetic memory according to claim 11, further comprising a field line that writes information to the first end portion.

18. The magnetic memory according to claim 11, further comprising a circuit electrically connected to the first electrode and the second electrode, the circuit configured to supply a current to the magnetic member via the first electrode and the second electrode to move a domain wall in the magnetic member.

19. A magnetic memory comprising:
 a nonmagnetic insulating material extending in a first direction;
 a magnetic member extending in the first direction and surrounding the nonmagnetic insulating material, the magnetic member having a cylindrical form and having an inside surface and an outside surface, the first direction being parallel to a central axis of the magnetic member, the magnetic member including a first end portion and a second end portion opposite to the first end portion in the first direction, the first end portion having an end face, which includes a face inclined with respect to a plane perpendicular to the first direction, the face of the end face crossing the outside surface and the inside surface;
 a first electrode electrically connected to the first end portion; and
 a second electrode electrically connected to the second end portion,
 wherein the nonmagnetic insulating material is surrounded by the first end portion.

20. The magnetic memory according to claim 19, wherein the first end portion includes a first portion and a second portion that is closer to the second end portion than the first portion in the first direction, a first cross-sectional area of the first portion in a plane perpendicular to the first direction being smaller than a second cross-sectional area of the second portion in a plane perpendicular to the first direction.

21. The magnetic memory according to claim 20, wherein the first end portion includes a part, a cross-sectional area of the part in a plane perpendicular to the first direction being constant along the first direction from the first portion to the second portion.

22. The magnetic memory according to claim 20, wherein the first end portion includes a part, a cross-sectional area of the part in a plane perpendicular to the first direction increasing along the first direction from the first portion to the second portion.

23. The magnetic memory according to claim 19, further comprising:
 a first magnetic layer extending in a second direction that crosses the first direction, the first magnetic layer being connected to the first end portion;
 a second magnetic layer disposed to face at least part of the first magnetic layer; and
 a nonmagnetic layer disposed between the at least part of first magnetic layer and the second magnetic layer.

24. The magnetic memory according to claim 19, further comprising:
 a magnetic layer extending in a second direction that crosses the first direction, the magnetic layer being connected to the first end portion; and
 a field line that writes information to the magnetic layer.

25. The magnetic memory according to claim 19, further comprising:
 a magnetic layer disposed to face an inner face of the first end portion; and
 a nonmagnetic layer disposed between the magnetic layer and the inner face of the first end portion.

26. The magnetic memory according to claim 19, further comprising a field line that writes information to the first end portion.

27. The magnetic memory according to claim 23, further comprising:

a circuit configured to supply a current to the magnetic member via the first electrode and the second electrode, wherein the first electrode is electrically connected to one of the first magnetic layer and the second magnetic layer.

28. The magnetic memory according to claim 19, further comprising a circuit electrically connected to the first electrode and the second electrode, the circuit configured to supply a current to the magnetic member via the first electrode and the second electrode to move a domain wall in the magnetic member.

29. A magnetic memory comprising:
a nonmagnetic insulating material extending in a first direction;
a magnetic member extending in the first direction and surrounding the nonmagnetic insulating material, the magnetic member having a cylindrical form and having an inside surface and an outside surface, the first direction being parallel to a central axis of the magnetic member, the magnetic member including a first end portion and a second end portion opposite to the first end portion in the first direction, the first end portion having an end face, which includes a first face that crosses the first direction and a second face that is different from the first face, the second face crossing the first direction and the first and second faces crossing the outside surface and the inside surface;
a first electrode electrically connected to the first end portion; and
a second electrode electrically connected to the second end portion,
wherein the nonmagnetic insulating material is surrounded by the first end portion.

30. The magnetic memory according to claim 29, wherein the first face and the second face connect to each other, and an angle at which the first face crosses the first direction is different from an angle at which the second face crosses the first direction.

31. The magnetic memory according to claim 29, wherein the first end portion includes a first portion and a second portion that is closer to the second end portion than the first portion in the first direction, a first cross-sectional area of the first portion in a plane perpendicular to the first direction being smaller than a second cross-sectional area of the second portion in a plane perpendicular to the first direction.

32. The magnetic memory according to claim 31, wherein the first end portion includes a part, a cross-sectional area of the part in a plane perpendicular to the first direction is constant along the first direction from the first portion to the second portion.

33. The magnetic memory according to claim 31, wherein the first end portion includes a part, a cross-sectional area of the part in a plane perpendicular to the first direction increasing along the first direction from the first portion to the second portion.

34. The magnetic memory according to claim 29, further comprising:
a magnetic layer disposed to face an inner face of the first end portion; and
a nonmagnetic layer disposed between the magnetic layer and the inner face of the first end portion.

35. The magnetic memory according to claim 29, further comprising a field line that writes information to the first end portion.

36. The magnetic memory according to claim 29, further comprising a circuit electrically connected to the first electrode and the second electrode, the circuit configured to supply a current to the magnetic member via the first electrode and the second electrode to move a domain wall in the magnetic member.

* * * * *